United States Patent
Ichikawa et al.

(10) Patent No.: US 10,701,827 B2
(45) Date of Patent: Jun. 30, 2020

(54) ELECTRICAL JUNCTION BOX WITH DIVIDED PORTIONS

(71) Applicant: Yazaki Corporation, Tokyo (JP)

(72) Inventors: Yoshiaki Ichikawa, Kakegawa (JP); Takao Shoji, Kakegawa (JP); Satoshi Hishikura, Kakegawa (JP); Hiroki Kayamori, Kakegawa (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 16/257,162

(22) Filed: Jan. 25, 2019

(65) Prior Publication Data

US 2019/0289741 A1    Sep. 19, 2019

(30) Foreign Application Priority Data

Mar. 16, 2018    (JP) ................... 2018-049646

(51) Int. Cl.
*H05K 7/14* (2006.01)
*H02G 3/08* (2006.01)
*B60R 16/023* (2006.01)

(52) U.S. Cl.
CPC ....... *H05K 7/1401* (2013.01); *B60R 16/0238* (2013.01); *H02G 3/08* (2013.01)

(58) Field of Classification Search
None
See application file for complete search history.

(56) References Cited

U.S. PATENT DOCUMENTS

| | | | | |
|---|---|---|---|---|
| 2,028,509 A | * | 1/1936 | Knell | H02G 3/086 220/3.94 |
| 4,428,492 A | * | 1/1984 | Jorgensen | H02G 3/086 174/53 |
| 4,620,265 A | * | 10/1986 | Lerude | H05K 7/1435 174/359 |
| 4,918,258 A | * | 4/1990 | Ayer | H02G 3/00 174/53 |
| 4,958,048 A | * | 9/1990 | Bell | H02G 3/125 174/53 |
| 5,581,130 A | | 12/1996 | Boucheron | |
| 5,619,013 A | * | 4/1997 | Jorgensen | H02G 3/086 174/53 |
| 5,747,734 A | * | 5/1998 | Kozlowski | H02B 1/305 174/37 |
| 6,229,087 B1 | * | 5/2001 | Archer | H02B 1/26 174/50 |

(Continued)

FOREIGN PATENT DOCUMENTS

DE    10 2015 115 624 A1    3/2017
EP         0 567 403 A1    10/1993

(Continued)

*Primary Examiner* — Timothy J Thompson
*Assistant Examiner* — Muhammed Azam
(74) *Attorney, Agent, or Firm* — Sughrue Mion, PLLC

(57) ABSTRACT

An electrical junction box 1, which is intended to be miniaturized, has a plurality of electric components and an installing portion on which the plurality of electric parts are installed. The installing portion is composed of a plurality of divided portions, and has fastening portions for connecting adjacent divided portions to each other, while adjusting the positions of the adjacent divided portions relative to each other.

3 Claims, 2 Drawing Sheets

(56) References Cited

U.S. PATENT DOCUMENTS

| | | | | |
|---|---|---|---|---|
| 6,359,218 B1* | 3/2002 | Koch | H05K 5/0021 | 174/50 |
| 6,406,257 B1* | 6/2002 | Houdek | F04D 25/166 | 415/213.1 |
| 6,520,605 B2* | 2/2003 | Nunokawa | H05K 5/0204 | 312/111 |
| 6,576,835 B1* | 6/2003 | Ford | H02G 3/086 | 174/135 |
| 6,751,091 B2* | 6/2004 | Dighde | H05K 7/14 | 312/323 |
| 6,903,272 B2* | 6/2005 | Dinh | H02G 3/086 | 174/54 |
| 7,078,619 B2* | 7/2006 | Chamberlain | G01V 1/16 | 174/37 |
| 7,196,902 B2* | 3/2007 | Albrecht | G06F 1/184 | 174/535 |
| 7,722,372 B2* | 5/2010 | Matsumoto | H01R 13/42 | 174/68.2 |
| 8,076,754 B2* | 12/2011 | Young | H01L 29/8605 | 257/538 |
| 8,088,998 B2* | 1/2012 | Nelson | H05K 5/0013 | 174/50 |
| 8,212,144 B1* | 7/2012 | Gretz | H02G 3/086 | 174/480 |
| 8,491,326 B2* | 7/2013 | Sato | H05K 7/026 | 439/404 |
| 8,907,213 B2* | 12/2014 | I | B60R 16/0238 | 174/50 |
| 9,040,820 B2* | 5/2015 | Kwon, II | H05K 5/0021 | 174/50 |
| 9,378,912 B2* | 6/2016 | Kawamura | H01R 13/73 | |
| 9,553,434 B2* | 1/2017 | Kawamura | H02G 3/086 | |
| 9,851,764 B2* | 12/2017 | Harvilchuck | G06F 1/185 | |
| 10,050,393 B1* | 8/2018 | Calabrese | H01R 27/00 | |
| 10,128,612 B1* | 11/2018 | Casto | H01R 13/6275 | |
| 2002/0009927 A1 | 1/2002 | Berberich et al. | | |
| 2002/0061666 A1 | 5/2002 | Sato | | |
| 2003/0178217 A1* | 9/2003 | Wang | B23K 1/0008 | 174/535 |
| 2004/0069518 A1* | 4/2004 | Fan | H05K 5/0021 | 174/50 |
| 2006/0261015 A1* | 11/2006 | Blackwell | H05K 5/0021 | 211/26 |
| 2007/0187126 A1* | 8/2007 | Liang | H05K 7/1411 | 174/50 |
| 2008/0006428 A1* | 1/2008 | Bryan | H02G 3/086 | 174/50 |
| 2008/0083547 A1* | 4/2008 | Pinol Pedret | H02G 3/088 | 174/50 |
| 2009/0107693 A1* | 4/2009 | Meyer | H02G 3/086 | 174/60 |
| 2009/0242267 A1* | 10/2009 | Nakayama | H05K 5/0073 | 174/520 |
| 2009/0314541 A1* | 12/2009 | Jones | H02G 3/086 | 174/559 |
| 2010/0282507 A1* | 11/2010 | Ludwig | G01P 1/023 | 174/541 |
| 2011/0061705 A1* | 3/2011 | Croft | H02S 40/32 | 136/244 |
| 2012/0079791 A1* | 4/2012 | Lord | F16B 5/0088 | 52/775 |
| 2012/0119632 A1* | 5/2012 | Bousseton | H05K 7/20745 | 312/236 |
| 2012/0228929 A1 | 9/2012 | Froschmeier et al. | | |
| 2013/0178083 A1* | 7/2013 | Ohmori | H02G 3/16 | 439/188 |
| 2014/0104761 A1* | 4/2014 | Hsu | H05K 7/1401 | 361/679.01 |
| 2014/0231130 A1* | 8/2014 | Temblador | H02G 3/085 | 174/535 |
| 2014/0242835 A1* | 8/2014 | Moran | H02G 3/083 | 439/528 |
| 2014/0273554 A1* | 9/2014 | Sugimoto | B60R 16/0238 | 439/76.2 |
| 2014/0322989 A1* | 10/2014 | Kaneko | H01R 4/34 | 439/723 |
| 2015/0156903 A1* | 6/2015 | Heimerl | H05K 5/0204 | 174/520 |
| 2015/0159852 A1* | 6/2015 | Dahlen | F21V 29/503 | 362/249.02 |
| 2015/0382497 A1* | 12/2015 | Kawamura | B60R 16/0238 | 361/728 |
| 2016/0049779 A1* | 2/2016 | Kawamura | H02G 3/081 | 174/541 |
| 2016/0049780 A1* | 2/2016 | Kawamura | H05K 5/0247 | 174/541 |
| 2016/0050777 A1* | 2/2016 | Kawamura | H05K 5/0217 | 174/549 |
| 2016/0268789 A1* | 9/2016 | Blaine | H02G 3/08 | |
| 2017/0353151 A1* | 12/2017 | Duan | H02S 40/34 | |
| 2017/0353152 A1* | 12/2017 | Duan | H02S 40/34 | |
| 2018/0018008 A1* | 1/2018 | Ammu | G06F 1/30 | |
| 2018/0183194 A1* | 6/2018 | Wang | H01R 4/30 | |
| 2018/0201208 A1 | 7/2018 | Wortberg et al. | | |
| 2019/0289741 A1* | 9/2019 | Ichikawa | B60R 16/0238 | |

FOREIGN PATENT DOCUMENTS

| | | |
|---|---|---|
| EP | 1 029 743 A2 | 8/2000 |
| EP | 1950096 A1 | 7/2008 |
| JP | 2001-204121 A | 7/2001 |
| JP | 2002-159118 A | 5/2002 |
| WO | 2011/026780 A1 | 3/2011 |

\* cited by examiner

ELECTRICAL JUNCTION BOX WITH DIVIDED PORTIONS

TECHNICAL FIELD

The present invention relates to an electrical junction box for mounting electric components such as relays and fuses.

BACKGROUND ART

For example, in order to electrically connect a battery, an inverter, and the like to each other, various electrical junction boxes are conventionally installed on an electric vehicle (including a hybrid vehicle) (see, for example, Patent Literature 1). The aforementioned electrical junction box has a fuse, a relay, a bus bar, etc., and is also called a junction block, a fuse block, and a relay box. In the present specification, these are collectively referred to as an electrical junction box.

The electrical junction box described in Patent Literature 1 includes an upper cover, a lower cover assembled to the upper cover, a wiring board accommodated between the upper cover and the lower cover, and the like. The electrical connection box is fixed to a vehicle body panel constituting a vehicle body of the vehicle.

Electric components such as fuses and relays are mounted on the upper cover. For this purpose, a relay terminal for connecting the above-mentioned terminal of the electric component with the wiring board is attached to the upper cover. The lower cover is provided with a connector housing to be fitted to a connector of the wire harness.

The wiring board electrically connects the terminal of the connector attached to the lower cover with the terminal of the electric component attached to the above-mentioned upper cover according to a predetermined pattern.

In such an electric junction box, a connector is attached to the lower cover, a relay terminal is attached to the upper cover, a wiring board is accommodated, and a lower cover is assembled to the upper cover. Then, the above-described electric components are attached to the upper cover. In this way, the electrical junction box is assembled.

CITATION LIST

Patent Literature

Patent Literature 1: JP 2002-159118 A

SUMMARY OF INVENTION

Technical Problem

When the conventional electric junction box described above is installed in an automobile such as an electric vehicle (including a hybrid car) traveling with the driving force of the electric motor, electric power flowing through the wiring board increases. Along with this, the electric power flowing in the relay as an electric component also becomes large, and the electric components themselves such as relays become large. That is, the size of the electrical junction box is increased. Here, the upper cover and the lower cover constituting the electric junction box are resin molded products, and are generally manufactured by injection molding using a mold. Therefore, as the size of the upper cover and the lower cover increases, it is necessary to set a large dimensional tolerance. That is, by giving a margin by the dimensional tolerance, the size of the electrical junction box itself increases.

An object of the present invention is to provide an electrical junction box which is intended to be miniaturized.

Solution to Problem

In order to solve the above problems and achieve the object, according to a first aspect of the present disclosure, there is provided an electrical junction box including: a plurality of electric components; and an installing portion on which the plurality of electric components are installed, wherein the installing portion includes: a plurality of divided portions; and fastening portions for connecting the adjacent divided portions to each other while positioning the adjacent divided portions relative to each other.

According to a second aspect of the present disclosure, there is provided the electrical junction box as described in the first aspect, wherein the fastening portions are formed in each of the adjacent divided portions, wherein each fastening portion has a hole portion into which a fixing member is inserted, and wherein the hole portion formed in at least one of the adjacent divided portions is an elongated hole and is connected by the fixing member, while the fastening portions are overlapped with each other.

According to a third aspect of the present disclosure, there is provided the electrical junction box as described in the second aspect, wherein the divided portions are joint-fastened to a vehicle body by means of the fixing member, while the fastening portions are overlapped with each other.

Effect of the Invention

According to the first aspect of the present disclosure, the installing portion includes: a plurality of divided portions; and fastening portions for connecting the adjacent divided portions to each other while positioning the adjacent divided portions relative to each other. Therefore, even if the tolerance dimension of the dividing portion is previously set to be small, by adjusting the position of the divided portions by the fastening portion, it is possible to bring the external size of the electric junction box close to the designed value. Therefore, it is not necessary to make the external dimensions with allowance in consideration of the tolerance dimension, and it is possible to reduce the size of the electric junction box.

DESCRIPTION OF EMBODIMENTS

Figure 1:
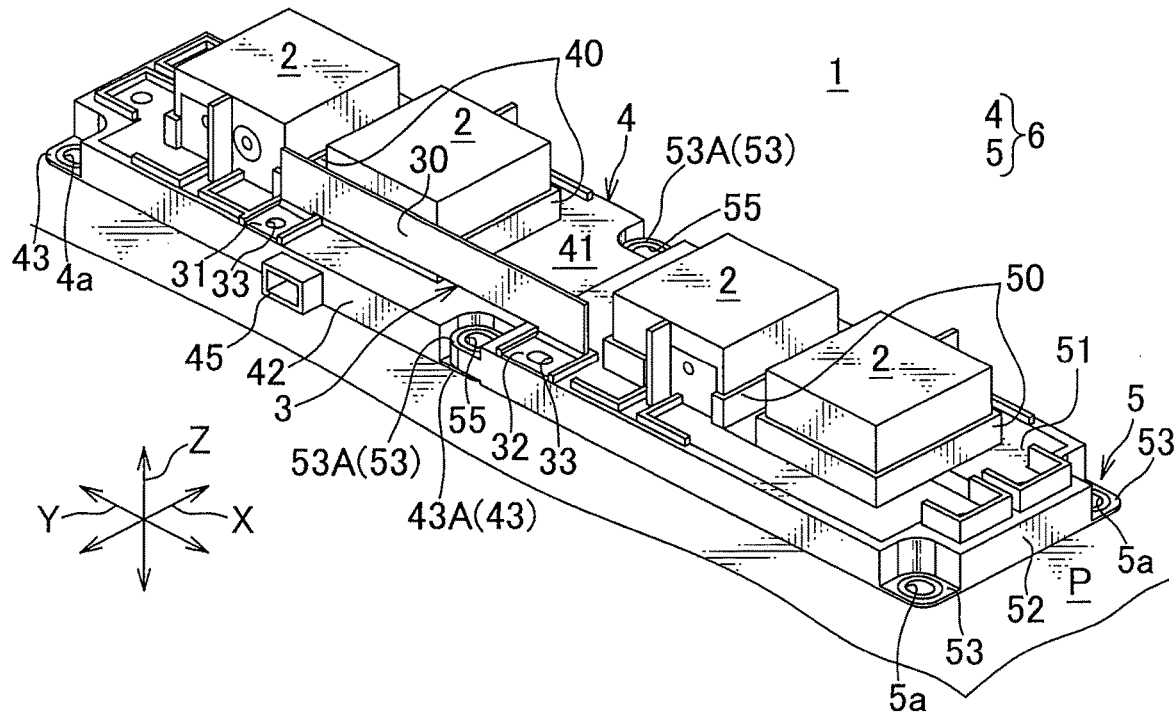
FIG. 1 is a perspective view showing an electrical junction box according to an embodiment of the present disclosure.

Hereinafter, an electrical junction box 1 according to one embodiment of the present invention will be described with reference to FIGS. 1 to 3. The electrical junction box 1 shown in FIG. 1 is installed on an automobile such as an electric vehicle (including a hybrid car) traveling by a driving force of an electric motor.

The electrical junction box 1 is installed on an automobile and distributes power from a power supply to a load. As shown in FIG. 1, the electrical junction box 1 includes electric components such as a fuse (not shown, an example of installed components) and a relay 2 (an example of installed components), an installing portion 6 having mounting portions 40 and 50 for mounting the electric components, and a wiring board (not shown). The installing portion 6 has upper covers (substitution with reference numerals 4 and 5) and a lower cover (not shown) assembled to the upper covers 4 and 5. The electrical junction box 1 is joint-fastened to a vehicle body panel P constituting a vehicle body by using bolts (not shown, fixing members) and nuts (not shown). In this embodiment, bolts are used as fixing members, but screws may be used instead of bolts.

Figure 2:
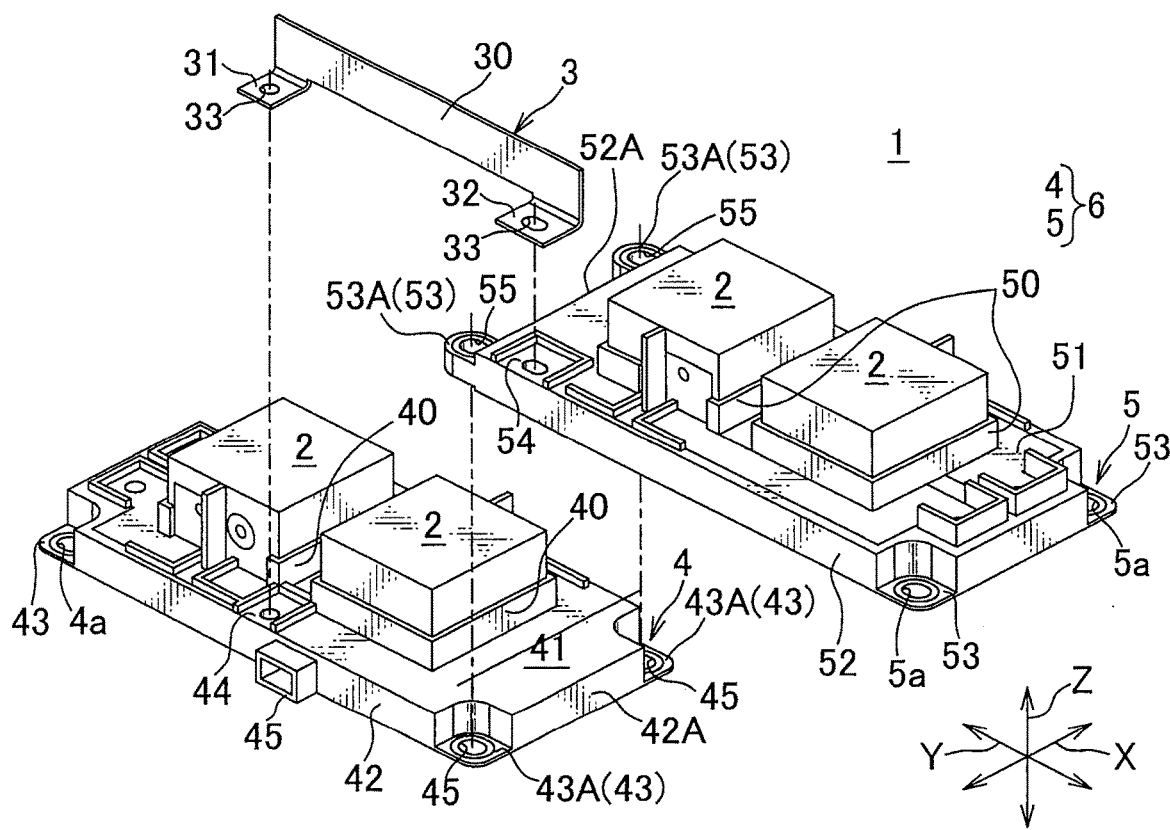
FIG. 2 is an exploded perspective view of the electrical junction box.
Figure 3:
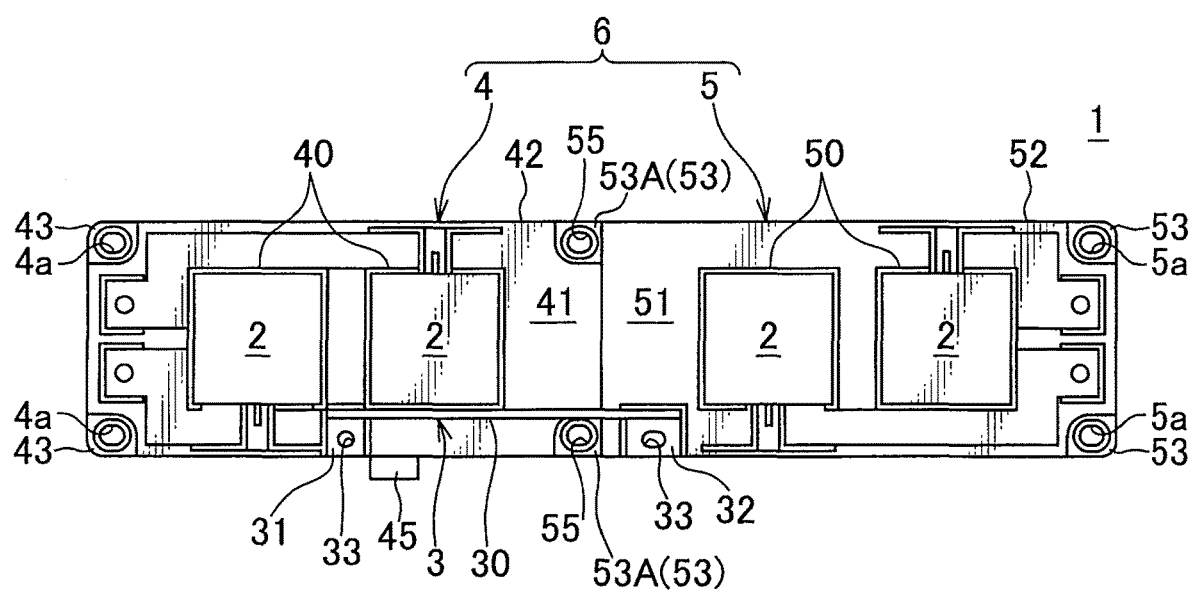
FIG. 3 is a plan view of the electrical junction box viewed from above.

As shown in FIG. 2, the installing portion 6 is composed of a plurality of (two in the illustrated example) divided portions 4, 5. Each of the two divided portions 4, 5 is formed in a substantially rectangular shape in plan view. The two divided portions 4, 5 are provided side by side in a longitudinal direction of each of the divided portions 4, 5. Hereinafter, in FIG. 1, the divided portion 4 located on a left side is referred to as "first divided portion 4", and the divided portion 5 located on a right side is referred to as "second divided portion 5". A direction in which the first divided portion 4 and the second divided portion 5 are arranged in the longitudinal direction of each divided portion 4, 5 is indicated by an arrow Y, a width direction of each divided portion 4, 5 is indicated by an arrow X, and a vertical direction orthogonal to both the arrow Y and the arrow X is indicated by an arrow Z.

The first divided portion 4 includes: a first top plate 41 provided with the mounting portion 40 for mounting electric components such as fuses (not shown, an example of installed components) and relays 2 (an example of installed components); a first peripheral plate 42 continuous with a peripheral edge of the first top plate 41 and erected in a frame shape downwardly; and four first hole portions 43 continuous with a lower edge of the first peripheral plate 42 and each having a bolt hole 4a to which a bolt is inserted. The four first hole portions 43 are provided below the first top plate 41. The four corners of the first top plate 41 are cut out in a circular arc shape. Each first hole portion 43 extends outward from a portion cut out in an arc shape of the first top plate 41. That is, the first hole portions 43 are provided at the four corners of the first divided portion 4. Hereinafter, among the four first hole portions 43, two first hole portions 43 located on the second divided portion 5 side may be referred to as "first joint-fastening hole portion 43A". The two first joint-fastening holes 43A are provided side by side in the width direction of the first divided portion 4.

Furthermore, a connector housing 45 into which a connector (not shown), which is a part of a wire harness (not shown), is inserted is formed in the first divided portion 4.

The second divided portion 5 includes: a second top plate 51 provided with a mounting portion 50 for mounting electric components such as fuses and relays 2; a second peripheral plate 52 continuous with a peripheral edge of the second top plate 51 and erected in a frame shape downwardly; and four second hole portions 53 continuous with a lower edge of the second peripheral plate 52 and having bolt holes 5a, 55 into which bolts are inserted. That is, the four second hole portions 53 are provided below the second top plate 51. In the second top plate 51, corner portions of the first divided portion 4 on the side away from the first top plate 41 are cut out in a circular arc shape. Among the four second hole portions 53, the two second hole portions 53 located on the side away from the first top plate 41 extend from portions cut out in the circular arc shape of the second top plate 51. The remaining two second hole portions 53 are formed so as to extend toward the first divided portion 4 and overlap an upper surface of the first hole portion 43 of the first divided portion 4. Hereinafter, among the four second hole portions 53, the two second hole portions 53 extending to the first divided portion 4 side may be referred to as "the second joint-fastening hole portion 53A". The two second joint-fastening hole portions 53A are provided side by side in the width direction of the second divided portion 5.

As shown in FIG. 1, in a state where the first divided portion 4 and the second divided portion 5 are fixed to the vehicle body panel P, the first joint-fastening hole portion 43A and the second joint-fastening hole portion 53A are positioned at substantially a middle part in a longitudinal direction of the installing portion 6. Further, as shown in FIG. 2, in a state where the first divided portion 4 and the second divided portion 5 are fixed to the vehicle body panel P, a plate portion 42A of the first peripheral plate 42 on the side of the second divided portion 5 and a plate portion 52A of the second circumferential plate 52 on the side of the first divided portion 4 are provided so as to be opposed to each other in the longitudinal direction Y.

Each of elongated holes 45, 55 is formed in the central part of each of the first joint-fastening hole portion 43A and the second joint-fastening hole portion 53A. Each elongated hole 45, 55 is formed in a track shape or an elliptical shape so that a size in predetermined one direction is larger than a size in the other direction orthogonal to the one direction. In the elongated holes 45 and 55, in a state where the first divided portion 4 and the second divided portion 5 are fixed to the vehicle body panel P, the one direction is along the longitudinal direction Y and the other direction is along the width direction X. Since the first joint-fastening hole portion 43A and the second joint-fastening hole portion 53A have the elongated holes 45, 55, positions of the divided portions 4, 5 can be adjusted by the longitudinal dimension of the elongated holes 45, 55, and an outer dimension of the installing portion 6 can be brought close to the design value.

Further, the divided portions 4, 5 are provided with a bus bar 3 (an example of installed components), one end of the bus bar 3 is bolted to the first top plate 41 of the first divided portion 4 and the other end of the bus bar 3 is bolted to the second top plate 51 of the second divided portion 5. The bus bar 3 is obtained by subjecting a sheet metal punched in a U-shape to a bending process, and includes a rectangular plate-like main body portion 30 and a pair of fixed portions 31, 32 formed at both ends in the longitudinal direction of the main body portion 30. A bus bar hole 33 into which a bolt is inserted is formed in each of the fixed portions 31, 32. A first bus bar fixing portion 44 for bolting one end of the bus bar 3 to the first divided portion 4 is provided on the first divided portion 4, and a second bus bar fixing portion 54 for bolting the other end of the bus bar 3 to the second divided portion 5 is provided on the second divided portion 5. That is, the bus bar 3 is fixed across the first divided portion 4 and the second divided portion 5.

Here, since each of the divided portions 4, 5 is a resin molded product, it is necessary to increase the dimensional tolerance when the size is increased. However, because the positions of the divided portions 4, 5 are adjusted by the fastening portions 43A, 53A, the outer dimensions of the installing portion 6 can be brought close to the designed value. Therefore, there is no need to make the external dimensions with a margin in consideration of the tolerance dimension, and the installing portion 6 can be downsized.

The wiring board electrically connects the terminal of the connector fitted to the connector housing 45 of the installing portion 6 and the terminal of the relay 2 attached to the installing portion 6 according to a predetermined pattern. Then, the wiring board electrically connects the battery and the electronic device such as an inverter to each other via the terminal of the connector and the terminal of the relay 2.

As shown in FIGS. 1 and 2, such an electrical junction box 1 is assembled in the following procedure.

First, as shown in FIG. 2, the fuses and relays 2 are previously attached to the respective mounting portions 40, 50 of the first divided portion 4 and the second divided portion 5. In this state, the lower cover is positioned to face the upper cover vertically, and the wiring board is accommodated between the upper cover and the lower cover. Then, the second joint-fastening holes 53A of the second divided portion 5 are overlapped on the upper surfaces of the respective first joint-fastening holes 43A of the first divided portion 4. In this state, the bolts are inserted into the bolt holes 4*a*, 5*a* at the four corners of the installing portion 6. Then, the positions of the divided portions 4 and 5 are adjusted, so that the external dimension of the installing portion 6 approaches the designed value. Thereafter, the bolts are inserted into the elongated holes 45, 55 of the first joint-fastening hole portion 43A and the second joint-fastening hole portion 53A, and joint-fastened and fixed to the vehicle body panel P.

Then, as shown in FIG. 1, one end of the bus bar 3 is brought close to the first bus bar fixing portion 44, and a bolt is inserted into the bus bar hole 33 to be fixed to the first bus bar fixing portion 44. Then, the other end of the bus bar 3 is brought close to the second bus bar fixing portion 54, and a bolt is inserted into the bus bar hole 33 to be fixed to the second bus bar fixing portion 54.

Finally, the connector is fitted into the connector housing 45 of the installing portion 6. In this way, the wiring board electrically connects the terminals of the connector with the terminals of the relay 2 attached to the installing portion 6 according to a predetermined pattern. In this way, the electrical junction box 1 is completed.

According to the above-described embodiment, the installing portion 6 is composed of a plurality of (two in the illustrated example) divided portions 4, 5, and has fastening portions 43A, 53A for connecting the divided portions 4, 5 with each other while adjusting the positions of the adjacent divided portions 4, 5. Therefore, even if the tolerance dimensions of the divided portions 4, 5 are previously set to be small, by adjusting the positions of the divided portions 4, 5 with the joint-fastening hole portions 43 A, 53 A (fastening portions), the installing portion 6 can be brought close to the design value. Therefore, it is not necessary to make the external dimensions with a margin in consideration of the tolerance dimensions, and it is possible to reduce the size of the electrical junction box 1.

In addition, since it is not necessary to set the external dimensions of the electrical junction box 1 to be an external dimension with allowance in consideration of the tolerance dimension, it is possible to set the dimension in the longitudinal direction of the bus bar hole 33 into which the bolt is inserted to be smaller by not considering the tolerance dimension. In addition, when transporting the installing portion 6 in a state of being divided into the first divided portion 4 and the second divided portion 5, it is possible to reduce the transportation cost by reducing the product size.

Further, since the first and second joint-fastening hole portions 43A and 53A are respectively provided with the elongated holes 45 and 55, the divided portions 4, 5 are adjusted in position, and the outer dimension of the installing portion 6 can be brought close to the design value.

Further, the divided portions 4, 5 are fastened to the vehicle body panel P (vehicle body) together with bolts as fixing members in a state where the joint-fastening hole portions 43A, 53A (fastening portions) are overlapped. That is, the divided portions 4 and 5 are connected to each other when fastened to the vehicle body panel P (vehicle body) at the same time, so that the number of fastening processes is not increased and it is possible not to hinder the efficiency of the assembly process. In addition, since the positions of the divided portions 4, 5 are adjusted and the external dimensions of the installing portion 6 are brought close to the designed values, space for installation of the electrical junction box 1 on the vehicle body panel P can also be saved.

It should be noted that the present invention is not limited to the above-described embodiment, but includes other configurations and the like that can achieve the object of the present invention, and the following modified examples are also included in the present invention.

In the above embodiment, the installing portion 6 is composed of two divided portions 4 and 5 arranged in the longitudinal direction Y, but the present invention is not limited thereto. The installing portion may be divided in the width direction X.

Further, in the above embodiment, the installing portion 6 is divided into two, but the present invention is not limited thereto. The installing portion 6 may be divided into three or more. According to this, substantially the same effect as the above-described embodiment is exhibited.

In the above-described embodiment, the elongated holes 45, 55 are respectively formed in the first joint-fastening hole portion 43A and the second joint-fastening hole portion 53A, but the present invention is not limited thereto. The elongated hole may be formed only in the first joint-fastening hole portion 43A or the elongated hole may be formed only in the second joint-fastening hole portion 53A.

Although the best configurations, methods, and the like for carrying out the present invention are disclosed in the above description, the present invention is not limited thereto. While the invention has been particularly shown and described with particular reference to certain embodiments thereof, it is evident that many alternatives, modifications and variations will be apparent to those skilled in the art without departing from the spirit and scope of the invention, and material, quantity, and other detailed configurations, various modifications can be made by those skilled in the art. Accordingly, the description that limits the shape, material, and the like disclosed above is illustratively described in order to facilitate the understanding of the present invention, and does not limit the present invention, so the shape and material, or the description of the part with the limitation of all parts removed is included in the present invention.

REFERENCE SIGNS LIST

1 electrical junction box
2 relays (an example of installed components)
3 bus bar (an example of installed components)
4 first divided portion (divided portion)
4*a* hole portion
5 second divided portion (divided portion)
6 installing portion
43A first joint-fastening hole portion (fastening portion)
45 elongated hole
53A second joint-fastening hole portion (fastening portion)
55 elongated hole
P vehicle body panel (vehicle body)

The invention claimed is:

1. An electrical junction box comprising: a plurality of electric components; and an installing portion on which the plurality of electric components are installed, wherein the installing portion includes: a plurality of divided portions; and fastening portions for slidably connecting adjacent divided portions of the plurality of divided portions to each other while slidably positioning the adjacent divided portions relative to each other with elongated holes with the electrical components installed thereon, and wherein a longitudinal direction of the elongated holes is perpendicular to an installation direction of the electric components.

2. The electrical junction box as claimed in claim 1,
wherein the fastening portions are formed in each of the adjacent divided portions,
wherein each fastening portion has a hole portion into which a fixing member is inserted, and
wherein the hole portion formed in at least one of the adjacent divided portions is the elongated hole and is connected by the fixing member, while the fastening portions are overlapped with each other.

3. The electrical junction box as claimed in claim 2,
wherein the divided portions are joint-fastened to a vehicle body by the fixing member, while the fastening portions are overlapped with each other.

* * * * *